United States Patent [19]

Clemen et al.

[11] Patent Number: 4,494,018

[45] Date of Patent: Jan. 15, 1985

[54] BOOTSTRAPPED LEVEL SHIFT INTERFACE CIRCUIT WITH FAST RISE AND FALL TIMES

[75] Inventors: Rainer Clemen, South Burlington, Vt.; Werner Haug, Böblingen, Fed. Rep. of Germany

[73] Assignee: International Business Machines Corporation, Armonk, N.Y.

[21] Appl. No.: 374,113

[22] Filed: May 3, 1982

[30] Foreign Application Priority Data

May 13, 1981 [EP] European Pat. Off. ........ 81103660.7

[51] Int. Cl.$^3$ ............... H03K 19/094; H03K 5/02; H03K 19/20
[52] U.S. Cl. ............................ 307/482; 307/475; 307/578; 307/264
[58] Field of Search ............ 307/448, 475, 482, 246, 307/573, 575, 577, 578, 584, 264

[56] References Cited

U.S. PATENT DOCUMENTS

| | | | |
|---|---|---|---|
| 4,029,973 | 6/1977 | Kobayashi et al. | 307/246 X |
| 4,122,361 | 10/1978 | Clemen et al. | 307/246 X |
| 4,239,993 | 12/1980 | McAlexander et al. | 307/355 |
| 4,353,104 | 10/1982 | Takayuki | 307/475 X |
| 4,382,194 | 5/1983 | Nakano et al. | 307/482 X |
| 4,406,956 | 9/1983 | Clemen et al. | 307/475 |
| 4,417,163 | 11/1983 | Otsuki et al. | 307/475 |

FOREIGN PATENT DOCUMENTS

| | | |
|---|---|---|
| 2935121 | 3/1980 | Fed. Rep. of Germany . |
| 2056807 | 3/1981 | United Kingdom . |

OTHER PUBLICATIONS

*IEEE Journal of Solid-State Circuits*, vol. SC-11, No. 3, Jun. 1976, Rolf Remshardt et al., "A High Performance Low Power 2048-Bit Memory Chip in MOSFET Technology and Its Application," pp. 352-359.

Sonoda, "MOSFET Powering Circuit" IBM Tech. Disc. Bull., vol. 13, No. 9, Feb. 1971, p. 2658.

*Primary Examiner*—Stanley D. Miller
*Assistant Examiner*—David R. Hudspeth
*Attorney, Agent, or Firm*—Theodore E. Galanthay; William N. Hogg

[57] ABSTRACT

An input circuit for a field effect transistor (FET) storage is described which consists of a bootstrap inverter which by a dynamically operating charge-up circuit is supplemented for charging up the bootstrap node to the full operating voltage, and which can be directly controlled with TTL levels without a level converter consisting of bipolar transistors being inserted. For that purpose, the input electrode of the bootstrap capacitor of the dynamically operating charge-up circuit is connected to the output of an inverter following the input circuit. Furthermore a discharge branch is provided for the node of the dynamically operating charge-up circuit. With its other end, together with the gate of the charge-up field effect transistor of the dynamic charge-up circuit, the discharge branch is connected to the output of another inverter following the first one. It is thus assured that when owing to the bootstrap effect the potential of the bootstrap node rises over the value VH of the operating voltage, this node cannot be discharged via the FET's in the charge-up circuit to the positive pole of the operating voltage source. This would counteract the rise of the potential of the bootstrap node so that the potential and the output of the input circuit would rise only slowly, and would not reach the full value VH of the operating voltage.

6 Claims, 6 Drawing Figures

4,494,018

BOOTSTRAPPED LEVEL SHIFT INTERFACE CIRCUIT WITH FAST RISE AND FALL TIMES

BACKGROUND OF THE INVENTION

The invention refers to an input circuit for a monolithically integrated semiconductor storage with field effect transistors, which circuit for intensifying the known bootstrap effect comprises a dynamic charge-up circuit.

Owing to their small size and low power consumption compared with monolithically integrated storage circuits of bipolar transistors, those of field effect transistors are widely used as main storages of modern, program-controlled data processing systems.

As an input circuit for a monolithically integrated semiconductor storage designed of field effect transistors, in the following called FET, a circuit utilizing the so-called bootstrap effect is frequently used, as known from German Offenlegungsschrift 22 43 671. Such a circuit which acts as an inverter provides, when the input level is dropping, an output level rapidly rising to the value of operating voltage VH.

FET storages are frequently controlled by digital circuits designed of bipolar transistors, because their switching speed is higher than that of field effect transistors. The so-called TTL level scheme is a typical voltage level scheme for digital circuits with bipolar transistors which is a lower signal level than the operating level of FET's. There, the one binary state, e.g. the logic "zero" is assumed to be represented by a voltage in the range of 0 to 0.8 Volt, and the other binary state, e.g. the logic "one" by a voltage in the range of 2.0 Volt up to the maximum operating voltage of, e.g., 5.5 Volt. However, the upper control level typical for FET circuits, as well as the operating voltage are much higher, e.g., as VH=8.5 Volt. This means that an MOS field effect transistor with a typical threshold voltage of 1.5 Volt which in the worst case is controlled with an upper input level of 2 Volt only conducts to a relatively low extent. A thus controlled FET has a relatively high impedance in its conductive state still. It is therefore rather slow in performing a requested charging or discharging of another circuit node, or capacitor, etc. For that reason, separate level converters are frequently used at the interfaces between bipolar and FET components.

SUMMARY OF THE INVENTION

According to the present invention, a bootstrap circuit converts a low level signal to a high level signal with fast rise and fall time with the up level being equal to the full operating voltage of the system, by charging and maintaining the bootstrap capacitor to the full operating voltage of the system.

DESCRIPTION OF THE PREFERRED EMBODIMENTS

Figure 1A:
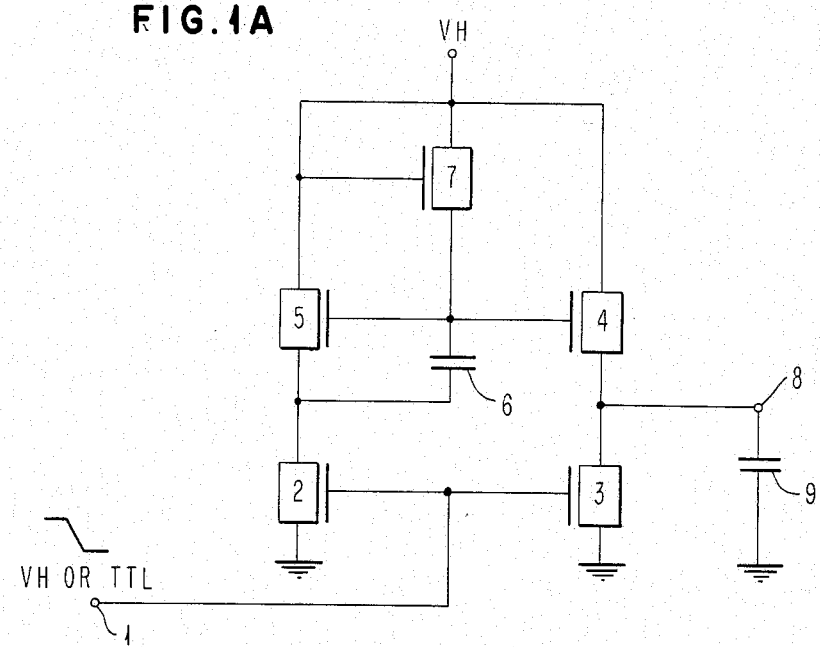
FIG. 1A is the circuit diagram of a prior art input circuit for an FET storage, with FET or TTL levels.

The circuit according to FIG. 1A, which is representative of one prior art technique, is preferably controlled with FET levels and, when FET's 2 and 3 are of correspondingly larger dimensions, also with TTL levels. The bootstrap inverter is formed by FET's 2, 3, 4, 5, and 7 and bootstrap capacitor 6. The interconnected gate electrodes of FET's 4 and 5 are charged up, via FET 7 wired to form a two-terminal circuit element, to operating voltage VH reduced by threshold voltage VT of FET 7. When the two input FET's 2 and 3 are rendered non-conductive, the potential of both electrodes of capacitor 6 is quickly raised (bootstrapped) via FET 5 because the input capacitor 9 of the circuit connected to output 8 of the inverter is not in parallel thereto.

Figure 1B:
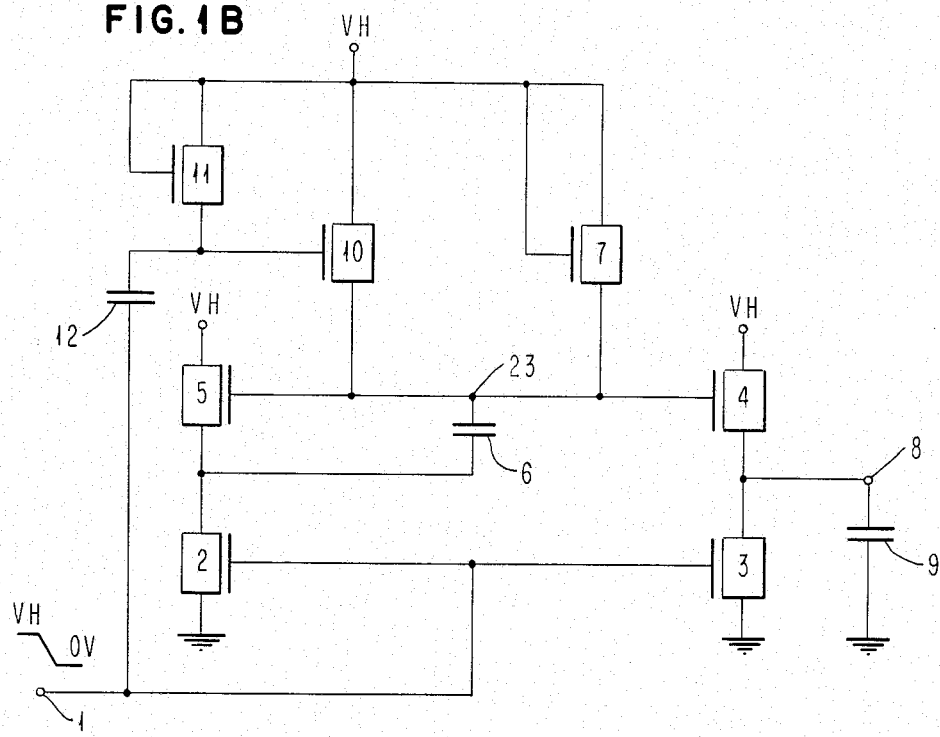
FIG. 1B is the circuit diagram of a prior art input circuit for an FET storage operating with FET levels.

For a better understanding of the invention, structure and operation of the prior art circuit according to FIG. 1B are briefly discussed in the following. This circuit consists of the bootstrap inverter of FIG. 1A, as known from German Offenlegungsschrift 22 43 671, and of a dynamic charge up circuit added thereto for the quicker charging of load capacitor 9. The bootstrap inverter is formed by FET's 2, 3, 4, 5, and 7 and by bootstrap capacitor 6; the dynamic charge-up circuit consists of FET's 10 and 11, and coupling capacitor 12.

Owing to the dynamic charge-up circuit comprised of FET's 10 and 11 and capacitor 12, the interconnected gate electrodes of FET's 4 and 5 are charged up via FET 7 not only to operating voltage VH reduced by the threshold voltage VT of FET 7, but upon the arrival of the rising edge of the input signal to the full value of operating voltage VH. Upon the arrival of the rising edge of the input signal which is transferred by capacitor 12 to the gate charged up to voltage VH-VT of FET 10, its gate potential rises approximately to value 2 VH-VT, so that its source potential 23, and the potential of the interconnected gate electrodes of FET's 4 and 5 consequently adopts the value VH. By thus charging up the gate electrodes to the full value VH of the operating voltage, the gate potential of the two load FET's 4 and 5 is increased to such an extent, when the input signal drops, and switching FET's 2 and 3 are consequently non-conductive, and the potential of bootstrap capacitor 6 rises via FET 5, that load capacitor 9 rises faster to the full operating voltage VH than it would if no dynamic charge-up circuit were used.

However, the advantageous circuit according to FIG. 1B has the disadvantage that it demands input signals of FET levels. If the control is effected with the low TTL levels, node 23 is not charged up by the charge-up circuit to VH owing to the low TTL potential swing of 2−0.8=1.2 Volt, and is thus of no value. Consequently, charge-up transistor T7 alone charges node 23 to a maximum of VH-VT only, as in the circuit of FIG. 1A.

As the circuit according to FIG. 1B cannot be used as an input circuit for an FET storage to be controlled with TTL levels, the present invention is to provide a remedy. The invention achieves the object of providing an input circuit for an FET storage, said circuit permitting in spite of control with TTL levels a fast charging of output node 8 through a charge-up of the gate of FET's 4 and 5 to operating voltage VH.

The main advantages of the invention consist in that a bipolar level converter converting the TTL levels into levels required for controlling FET storages is no longer necessary.

In all of the circuits described conventional N-channel-MOS-FET's are assumed whose typical operating voltage VH is approximately 8.5 Volt. However, the invention can equally be realized with FET's of the other conductivity type, i.e., P-channel, and with a correspondingly modified operating voltage.

Figure 2:
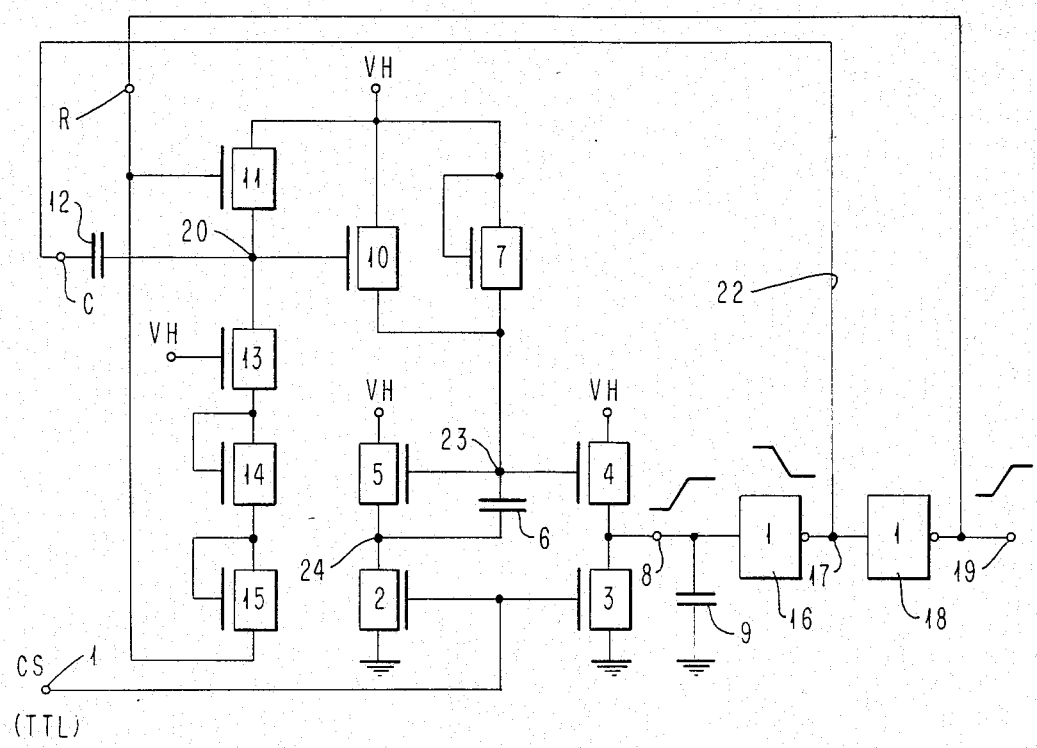
FIG. 2 is the circuit diagram of an input circuit according to the invention for an FET storage, followed by two further inverter stages represented as a block diagram.

FIG. 2 shows the circuit diagram of a first embodiment of the invention. This FET storage input circuit controllable with TTL-levels is a variation of the circuit according to FIG. 1B. Components of the circuit of FIG. 2 corresponding to those of the circuit of FIG. 1B have been given the same reference numbers. Since the dynamic charge-up circuit which consists of FET's 10 and 11 and coupling capacitor 12, and which is provided for the interconnected gate electrodes of FET's 4 and 5 requires for its operation control with FET levels, the first electrode of capacitor 12 in the circuit of FIG. 2 is not connected to input terminal 1; rather it is connected to output 17 of an inverter 16 shown in block form only and following the input circuit for the FET storage. Furthermore, the gate of the charge-up FET 11 in FIG. 2 is not connected to the positive pole VH of the supply voltage, but to output 19 of an inverter 18 following in series inverter 16, inverter 18 being also represented in block form only. Furthermore, the common point of connection 20 of the second electrode of capacitor 12 with the source of charge-up FET 11 and of the gate of load FET 10 is connected, via the series-arrangement of the three discharge FET's 13, 14, and 15, to the FET 11 gate connected to output 19 of inverter 18.

The operation of the input circuit of FIG. 2 is described in connection with the pulse diagrams according to FIG. 3. It is assumed that the TTL signal (FIG. 3) which is applied to input terminal 1 of the input circuit, and which first in the off-state had shown the high TTL level, now adopts the signal down level. The switching FET's 2 and 3 which had been conductive up to now are thus rendered non-conductive, so that output 8 of the input stage which formerly had shown the FET signal down level now quickly adopts the high FET output level, owing to the known effect of bootstrap capacitor 6. When the potential of node 23 rises over value VH owing to the bootstrap effect of capacitor 6, no current flows through FET 10 to the positive pole VH of the operating current source, for this would counteract the voltage increase at node 23 caused by bootstrap capacitor 6 upon the rise of the potential of node 24. The output potential of output 8 would thus rise more slowly, and it would not reach the full value of operating voltage source VH. FET's 13, 14 and 15, and their control pulse 19 which is in opposite phase to the input signal, discharge gate 20 of FET 10 prior to the dropping of input signal 1 to a potential lower than VH-VT, so that when potential 23 rises over value VH, FET 10 is reliably non-conductive. The gate of FET 13 is connected to positive pole VH of the operating voltage source, so that this FET is always conductive. By means of connecting drain and gate, FET's 14 and 15 are wired to form two-terminal circuit elements.

The input circuit of FIG. 2 is preferably provided as a level converter in a dynamic FET storage chip. The TTL chip selection signal CS can, e.g., be applied to input 1. The longest CS cycle is in the region of 100 microseconds, since for refreshing the dynamic storage cells the storage chip has to be continuously selected. The input circuit itself is thus refreshed, too. Node 23, to give an example, is discharged through leakage currents in 100 microseconds to only slightly less than value VH. When the storage is initiated however the charge-up circuit is still ineffective, and node 23 is maintained by FET 7 alone on a potential slightly beneath value VH-VT. At the beginning of the first cycle therefore the voltage at output 8 of the input circuit rises only with a delay, and slowly, owing to the low potential VH-VT at node 23. At the end of the first cycle, node 23 is charged to potential VH via the charge up circuit, i.e., via FET 10. In the second and all subsequent cycles, the output voltage rises practically without delays, and very quickly.

Figure 3:
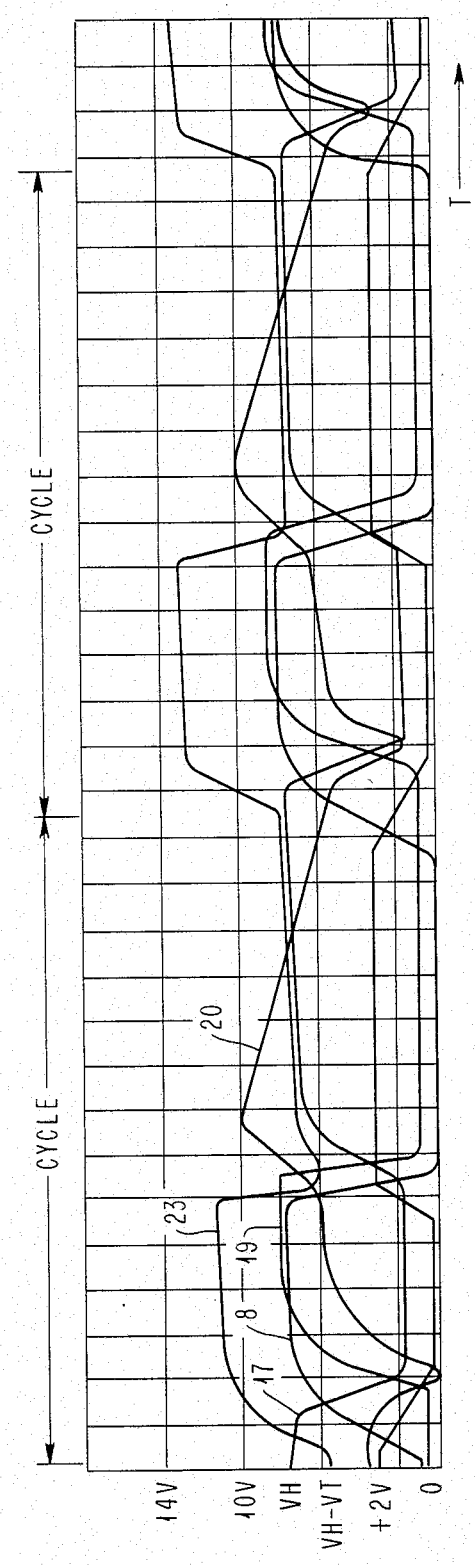
FIG. 3 is a pulse diagram for the input circuit according to FIG. 2.

FIG. 3 shows a pulse diagram for the input circuit as disclosed by the invention, representing the change of potential as a function of time at the various nodes of the circuit. The diagram shows that after the first cycle the rise time for the potential of output 8 is approximately only half the value reached in the first cycle. The cycle time is assumed to be 360 nanoseconds.

Figure 4:
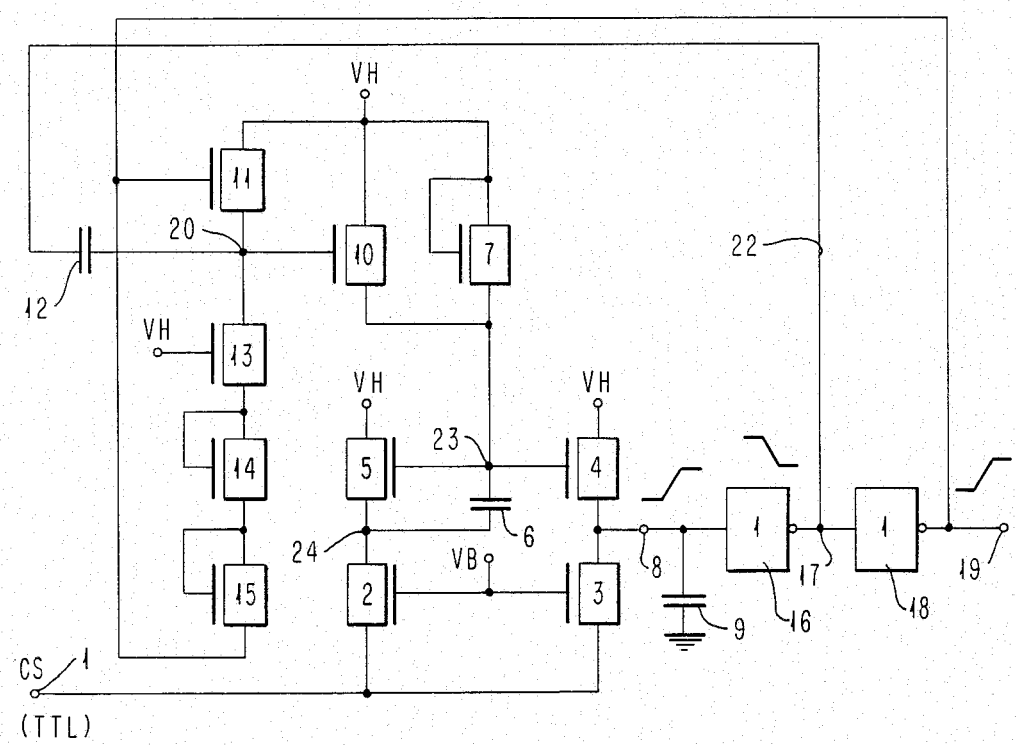
FIG. 4 is the circuit diagram of a second embodiment in accordance with the invention.
Figure 5:
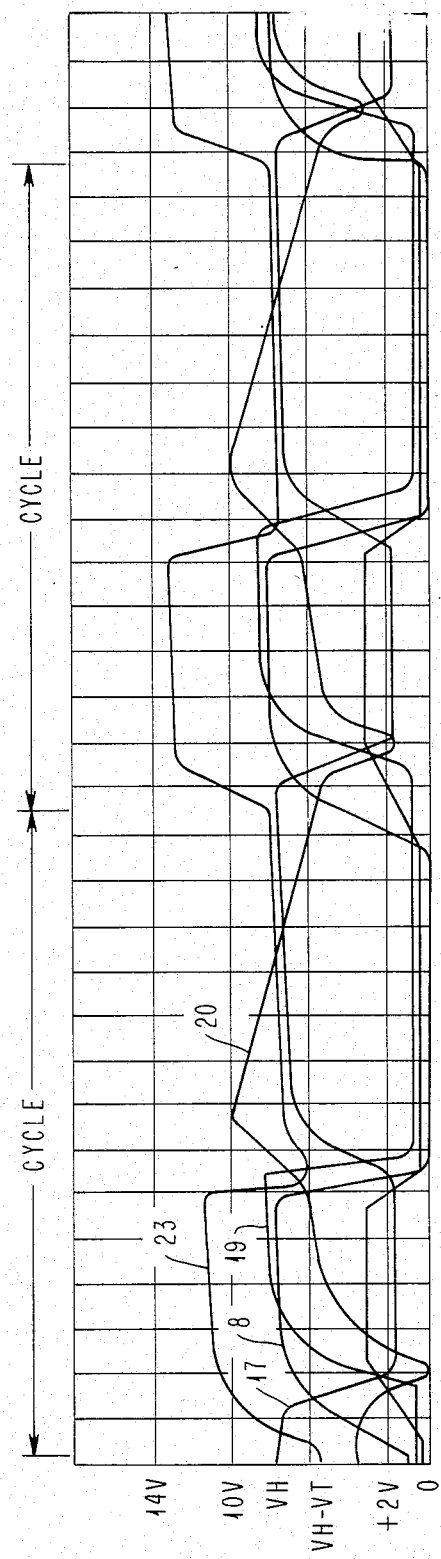
FIG. 5 is a pulse diagram for the input circuit according to FIG. 4.

FIG. 4 is the circuit diagram of another embodiment of the invention. It differs from that of FIG. 2 merely in that the switching transistors 2 and 3 are controlled at the interconnected source electrodes, whereas a fixed bias potential VB is applied to their interconnected gate electrodes. Owing to this feature of the circuit, the input signal is in phase with the output signal appearing at output 8. There are no further differences with respect to the circuit diagram of the FIG. 2. The operation of the circuit of FIG. 4 also corresponds to that described in connection with FIG. 2. This is demonstrated by the pulse diagram of FIG. 5, where only the TTL input signal applied to terminal 1 shows the opposite phase compared with the pulse diagram of FIG. 3.

As mentioned above, the circuits of FIG. 2 and FIG. 4 are particularly suited as level converters and signal amplifiers for the chip selection signal. Since the latter has to drive a very high capacitive load in a storage chip, inverters 16 and 18 are not additionally required for the invention but provided for amplification purposes at any rate.

What is claimed is:

1. In an input circuit having an input node and an output node, for a monolithically integrated semiconductor storage of field effect transistors, which input circiut is controlled with low signal levels applied to its input node and which input circuit for level conversion uses bootstrap means, and which input circuit contains a dynamically operating charge-up circuit for charging up a bootstrapping node of the bootstrap means to the operating voltage, the improvement in the charge-up circuit comprises:

a coupling capacitor having an input node and an output node;

a first inverter having its input connected to the output node of the input circuit and its output connected to the input node of the coupling capacitor;

first and second FET's, the gate of the first FET and the source of the second FET being connected to the output node of said coupling capacitor, the drain of said first and second FET's being connected in common to a voltage source;

- a discharge circuit having one end connected to the output node of the coupling capacitor, the opposite end of the discharge circuit being connected to the gate of the second FET;
- a second inverter having its input connected to the output of the first inverter and its output connected to the gate of the second FET;
- said first FET having its source connected to the said bootstrapping node of the bootstrap means, whereby the charge-up circuit causes the bootstrap means to be maintained at full operating voltage.

2. A circuit as claimed in claim 1, wherein the discharge circuit comprises a series connection of a plurality of FET's, the first of which is connected to the output node of said coupling capacitor and is maintained continuously conductive, the other of said plurality of FET's being at least one load FET, with its gate electrode being connected to its drain electrode, its source electrode being connected to the gate of said second FET.

3. A circuit as in claim 1 or 2, wherein the input circuit comprises an inverter.

4. A circuit as in claim 1 or 2, wherein the input circuit comprises a non-inverting buffer.

5. A circuit as in claim 1 or 2, wherein the FET's are N-channel.

6. A circuit as in claim 1 or 2, wherein the FET's are P-channel.

* * * * *